United States Patent
Lee et al.

(10) Patent No.: US 9,527,235 B2
(45) Date of Patent: Dec. 27, 2016

(54) APPARATUS AND METHOD FOR LIQUID TRANSFER IMPRINT LITHOGRAPHY USING A ROLL STAMP

(71) Applicant: KOREA INSTITUTE OF MACHINERY & MATERIALS, Daejeon (KR)

(72) Inventors: Jae-Jong Lee, Daejeon (KR); Hyung-Jun Lim, Daejeon (KR); Kee-Bong Choi, Daejeon (KR); Gee-Hong Kim, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 309 days.

(21) Appl. No.: 14/389,509

(22) PCT Filed: Dec. 27, 2013

(86) PCT No.: PCT/KR2013/012297
§ 371 (c)(1),
(2) Date: Sep. 30, 2014

(87) PCT Pub. No.: WO2014/175535
PCT Pub. Date: Oct. 30, 2014

(65) Prior Publication Data
US 2015/0266234 A1    Sep. 24, 2015

(30) Foreign Application Priority Data

Apr. 24, 2013 (KR) .................. 10-2013-0045213

(51) Int. Cl.
*B29C 43/02* (2006.01)
*B29C 59/04* (2006.01)
(Continued)

(52) U.S. Cl.
CPC ............. *B29C 59/046* (2013.01); *B29C 43/02* (2013.01); *B29C 43/203* (2013.01);
(Continued)

(58) Field of Classification Search
None
See application file for complete search history.

(56) References Cited

FOREIGN PATENT DOCUMENTS

| KR | 100842931 | * | 7/2008 |
|---|---|---|---|
| KR | 101005584 B1 | | 1/2011 |

(Continued)

OTHER PUBLICATIONS

International Search Report mailed Mar. 28, 2014 in International Application No. PCT/KR2013/012297, filed Dec. 27, 2013.
(Continued)

*Primary Examiner* — Edmund Lee
(74) *Attorney, Agent, or Firm* — Hauptman Ham, LLP (57) ABSTRACT

In an apparatus and a method for liquid transfer imprint lithography, the apparatus includes a roll unit, a plane unit and a control unit. The roll unit includes a roll stamp, a horizontal moving stage, a roll angular compensating stage and a roll rotating part. The plane unit is disposed under the roll unit and includes a first substrate, a first fixing chuck, a first substrate driving part, a second substrate, a second fixing chuck and a second substrate driving part. The control unit controls an operation of the roll unit and the plane unit.

6 Claims, 12 Drawing Sheets

(51) Int. Cl.
    *G03F 7/00*      (2006.01)
    *B29C 43/20*     (2006.01)
    *B29K 105/00*    (2006.01)
    *B29C 43/22*     (2006.01)
(52) U.S. Cl.
    CPC .......... *G03F 7/0002* (2013.01); *B29C 43/222* (2013.01); *B29C 2043/025* (2013.01); *B29K 2105/0058* (2013.01)

(56) References Cited

FOREIGN PATENT DOCUMENTS

| KR | 101158110 | * | 6/2012 |
| KR | 101158110 B1 | | 6/2012 |
| KR | 101200833 B1 | | 11/2012 |
| KR | 1332323 | * | 11/2013 |
| KR | 20140033851 | * | 3/2014 |

OTHER PUBLICATIONS

Written Opinion mailed Mar. 28, 2014 in International Application No. PCT/KR2013/012297, filed Dec. 27, 2013.

* cited by examiner

APPARATUS AND METHOD FOR LIQUID TRANSFER IMPRINT LITHOGRAPHY USING A ROLL STAMP

RELATED APPLICATIONS

The present application is a U.S. National Phase of International Application PCT/KR2013/012297, filed Dec. 27, 2013, and claims priority from Korean Application Number 10-2013-0045213, filed Apr. 24, 2013.

BACKGROUND

1. Field of Disclosure

The present disclosure of invention relates to an apparatus and a method for liquid transfer imprint lithography using a roll stamp. More particularly, the present disclosure of invention relates to an apparatus and a method for liquid transfer imprint lithography using a roll stamp capable of stably and more effectively performing imprint lithography.

2. Description of Related Technology

Generally, imprint lithography is widely used for forming micro or nano size patterns in the imprint lithography, a stamp on which a pattern is formed is contacted and pressed on a substrate on which a resist is coated, and then the pattern of the stamp is transferred to the resist at the same time when the resist is cured or hardened by heating or irradiating of ultraviolet ray.

In the imprint lithography, a thickness of a residual layer is very important to be decreased. When the pattern is transferred on the coated resist, a difference between an area in which the pattern is formed or an area in which the pattern is not formed depends on the stamp, but the thickness of the area in which the pattern is not formed mainly depends on the thickness of the initially coated resist. Thus, a lot of studies have been performed to decrease the thickness of the initially coated resist.

Among the studies, liquid transfer type imprint lithography is applied to decrease the thickness of the residual layer, such as "Liquid Transfer Imprint Lithography: A new route to residual layer thickness control", N. I. Koo, J. W. Kim, M. Otto, C. Moormann, H. Kurz, EIPBN 2011—the 55$^{th}$ international conference on electron, ion, and photon beam technology and nanofabrication (hereinafter, Koo et al.).

However, Koo et al. merely disclosed a technology applied to a limited surface, and thus hard to be applied to a large-sized substrate or a flexible substrate.

Further, recently a roll type stamp is more widely used to transfer to the flexible substrate of the large-sized substrate. In the roll type stamp, a continuous line contact is possible such that the transfer is performed faster and more cheaply. Thus, in a new trend, a new technology is necessary to solve the above-mentioned problem.

SUMMARY

The present invention is developed to solve the above-mentioned problems of the related arts. The present invention provides an apparatus and a method for liquid transfer imprint lithography using a roll stamp capable of stably and more effectively performing imprinting lithography.

According to an example embodiment, the apparatus includes a roll unit, a plane unit and a control unit. The roll unit includes a roll stamp, a horizontal moving stage, a roll angular compensating stage and a roll rotating part. The roll stamp has a hollow cylindrical shape, has a hardening or curing element and has a pattern formed on an outer surface of the roll stamp. The horizontal moving stage moves the roll stamp along an X axis. The roll angular compensating stage adjusts an angle of the roll stamp. The roll rotating part rotates the roll stamp with a constant velocity. The plane unit is disposed under the roll unit and includes a first substrate, a first fixing chuck, a first substrate driving part, a second substrate, a second fixing chuck and a second substrate driving part. A flat resist is coated on the first substrate. The first fixing chuck is disposed over a table and the first substrate is fixed at the first fixing chuck. The first substrate driving part vertically moves the first fixing chuck along a Z axis. The second substrate is spaced apart from the first substrate and is arranged with the first substrate in parallel. The second fixing chuck is disposed over the table and the second substrate is fixed to the second fixing chuck. The second substrate driving part vertically moves the second fixing chuck along the Z axis. The control unit controls an operation of the roll unit and the plane unit. The roll stamp and the first substrate makes contact with each other and are pressed with each other so that the resist attached to the surface of the roll stamp being re-transferred to the second substrate.

In an example embodiment, the roll unit may further include an angular sensor measuring a rotating angle of the rollstamp rotated with the constant velocity by the roll rotating part.

In an example embodiment, the hardening or curing element may include an ultraviolet irradiating device irradiating ultraviolet rays along a lower direction to a surface on which the roll stamp and the plane unit make the line contact with each other. First and second adjusting stages may be connected to both sides of the hardening or curing element such that a position along a yaw direction and the X axis is adjusted.

In an example embodiment, the hardening or curing element may include a heating device heating a surface on which the roll stamp and the plane unit make the line contact with each other.

In an example embodiment, the control unit may turn off the hardening or curing element when the roll stamp and the first substrate make contact with each other. The control unit may turn on the hardening or curing element when the roll stamp and the second substrate make contact with each other.

According to another example embodiment, a method for liquid transfer imprint lithography using the apparatus includes aligning the roll stamp at a position using the horizontal moving stage and the roll angular compensating stage. The first substrate moves to an upper portion using the first substrate driving part so that a side end portion of the first substrate on which the flat resist is coated and the roll stamp make the line contact with each other and are pressed with each other with a predetermined pressure. First transfers in which the roll rotating part rotates the roll stamp with the constant velocity and the horizon moving stage moves the roll stamp from a first side of the first substrate to a second side of the first substrate opposite to the first side, and thus the resist of the first substrate are partially attached to the surface of the roll stamp. The second substrate moves to the upper portion using the second substrate driving part so that the roll stamp is positioned at aside end portion of the second substrate after moving the first substrate to a lower direction. Second transfers in which the roll stamp makes contact and are pressed with the second substrate and moves from a first side of the second substrate to a second side of the second substrate opposite to the first side so that the resist attached to the surface of the roll stamp is transferred to the second substrate and the resist is hardened or cured by turning on the hardening or curing element in the area in which the roll stamp and the second substrate make contact with each other.

According to the present invention, the surface pattern of the roll stamp is transferred to the resist when the resist is re-transferred to the second substrate after the resist coated on the first substrate is transferred to the roll stamp, so that nano imprint process may be more stably performed to the large-sized or flexible substrate using the liquid transfer imprinting method.

More specifically, the apparatus according to the present example embodiment includes the roll stamp having a hardening or curing element and the roll unit adjusting a position and a rotation of the roll stamp, and thus the roll stamp may make a line contact with the first and second substrates and the curing or the hardening may be performed in the line contact area at the same time.

Further, the hardening or curing element is equipped inside of the roll stamp, and thus the equipment may be set up more easily, and the hardening or curing element may be more accurately aligned in the line contact area. Thus, the nano imprinting process may be performed more precisely and more accurately.

In addition, the first and second substrates may be independently controlled to move along a Z direction, and thus the pattern may be continuously transferred due to the rotation and the horizontal movement of the roll stamp.

Accordingly, the roll stamp and the plane substrate make a continuous line contact with each other, and thus the apparatus according to the present example embodiments may be variously used in the patterning methods including hardening or curing the line contact area.

BRIEF DESCRIPTION OF THE DRAWINGS

The above and other features and advantages will become more apparent by describing exemplary embodiments thereof with reference to the accompanying drawings, in which.

DETAILED DESCRIPTION

Hereinafter, exemplary embodiment of the invention will be explained in detail with reference to the accompanying drawings.

Figure 1:
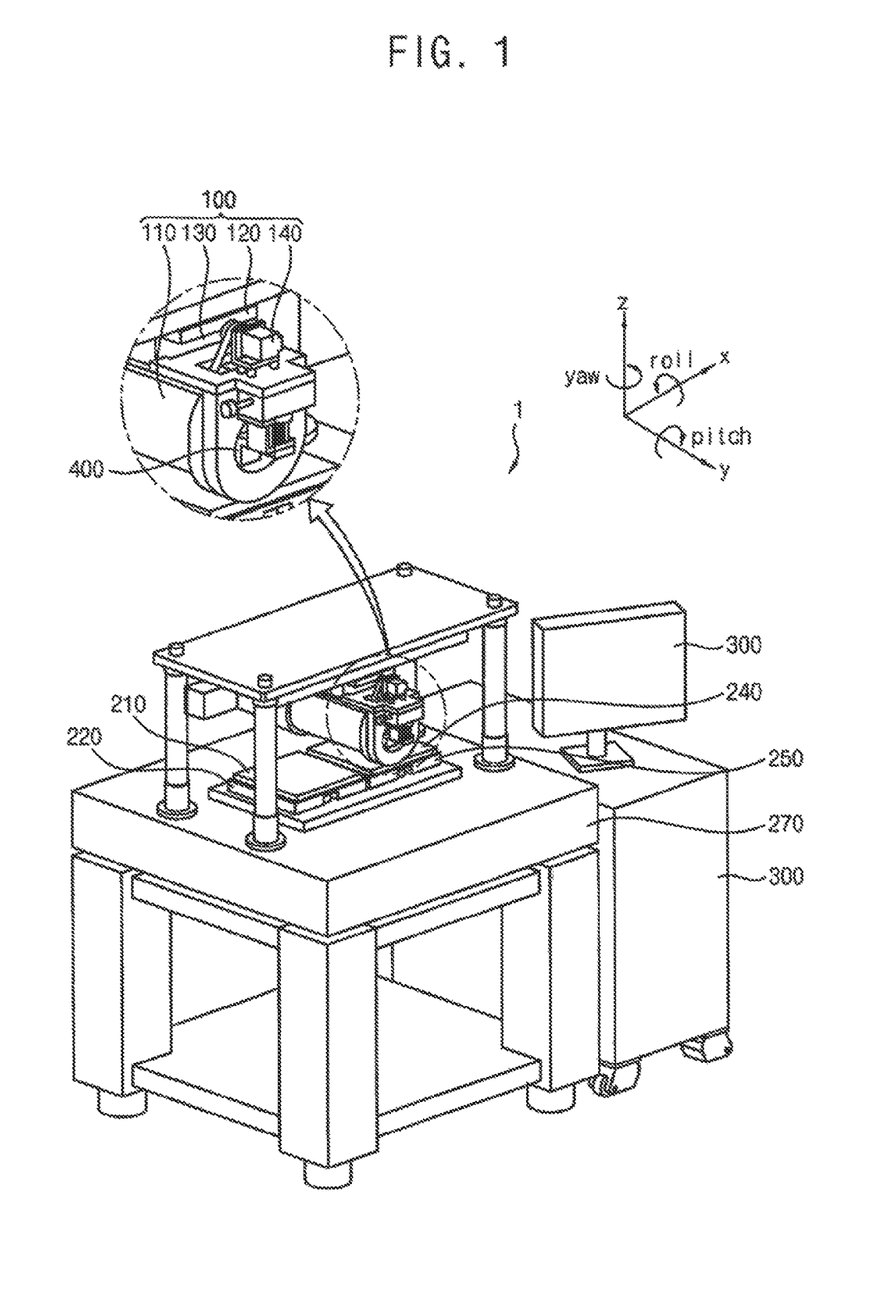
FIG. 1 is a perspective view illustrating an apparatus for liquid transfer imprint lithography according to the present example embodiment of the present invention.
Figure 2:
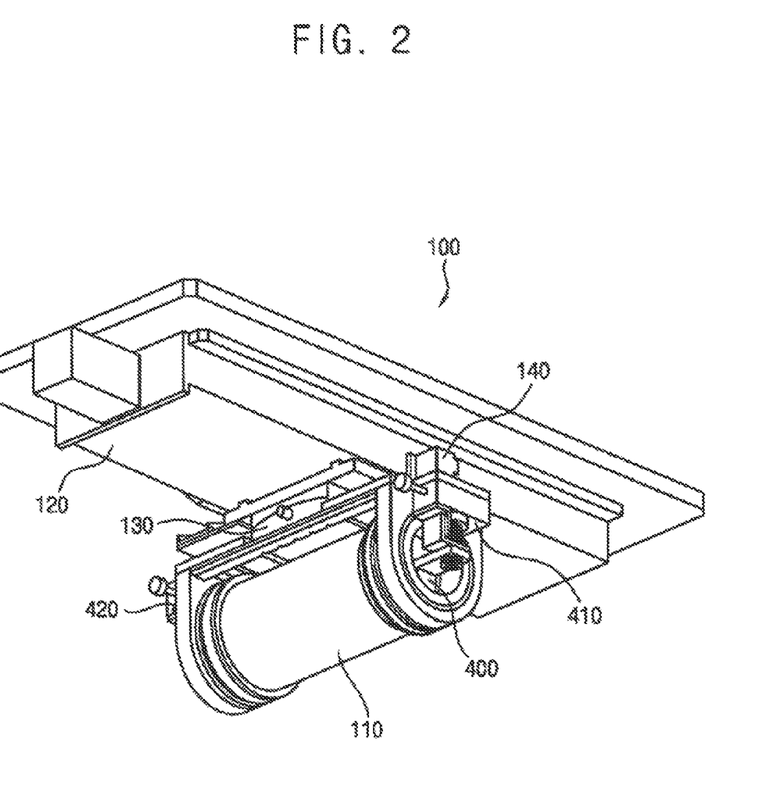
FIG. 2 is a perspective view illustrating a roll unit of the apparatus for the liquid transfer imprint lithography in FIG. 1.
Figure 3:
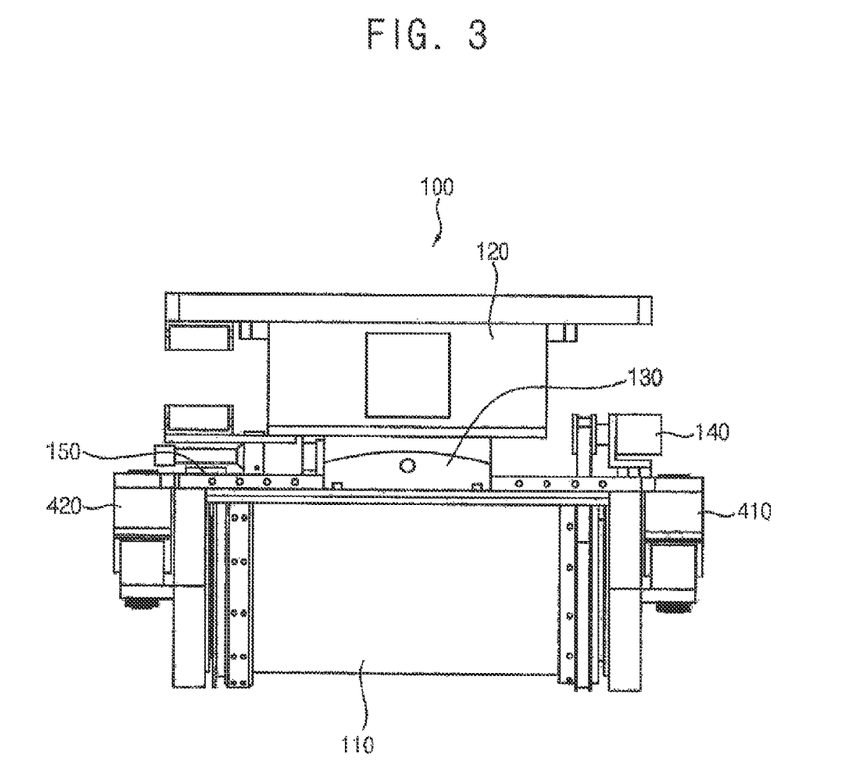
FIG. 3 is a side view illustrating a roll unit of the apparatus for the liquid transfer imprint lithography in FIG. 1.
Figure 4A:
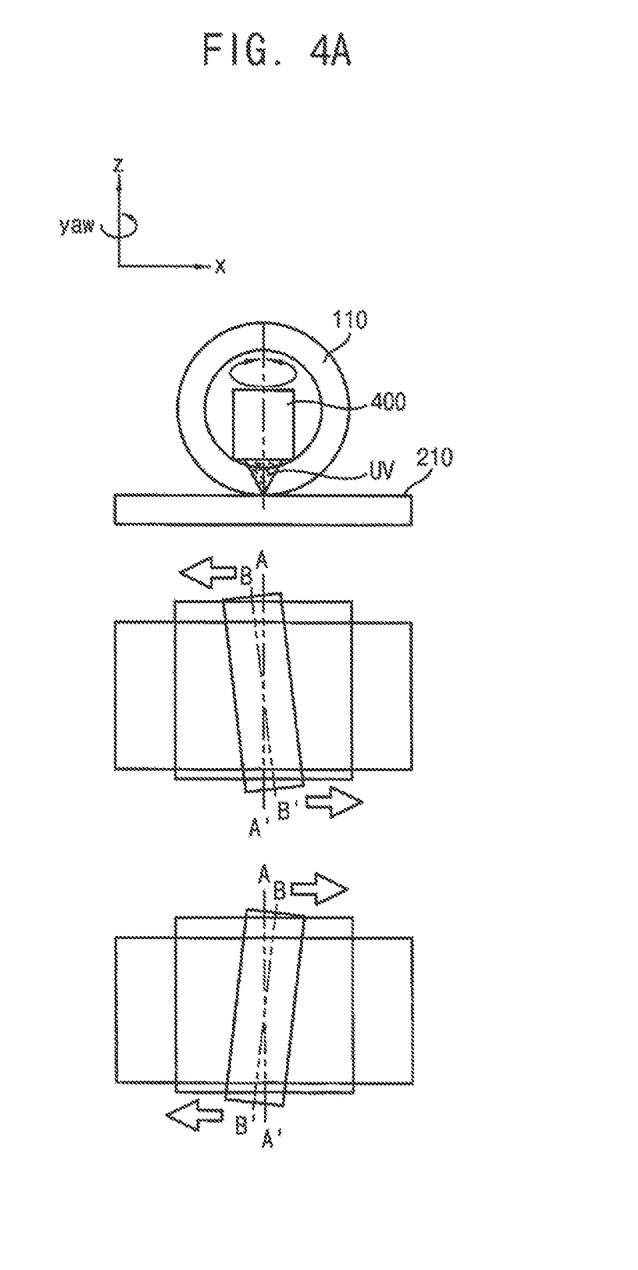
FIGS. 4A and 4B are process diagrams of adjusting a position when ultraviolet rays are irradiated as a curing element in the apparatus for the liquid transfer imprint lithography in FIG. 1.
Figure 4B:
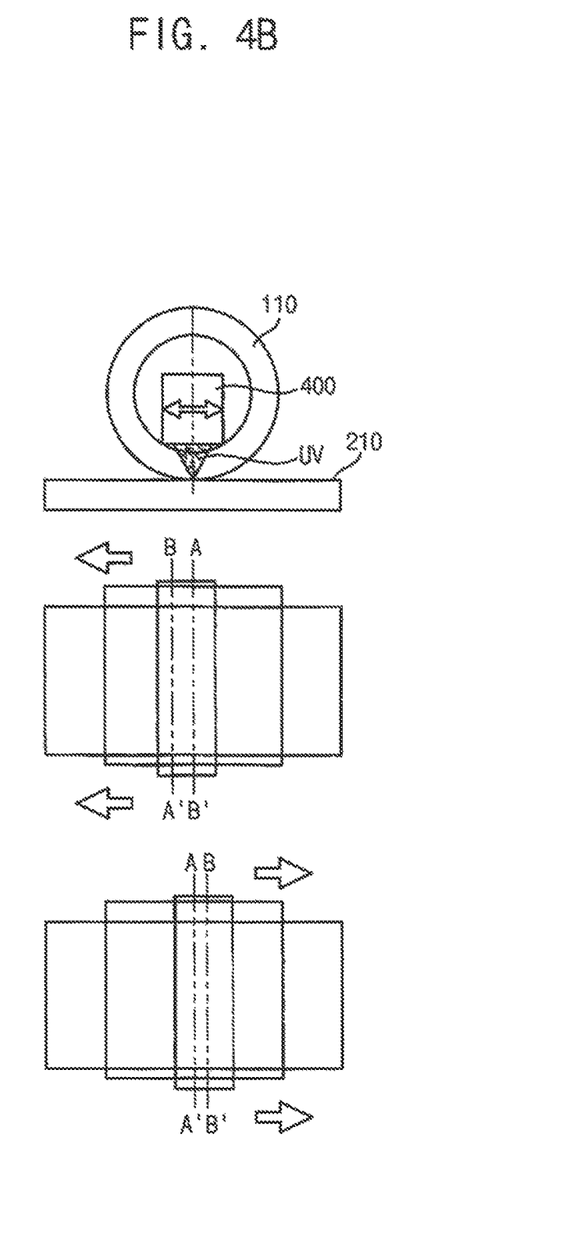
Figure 5A:
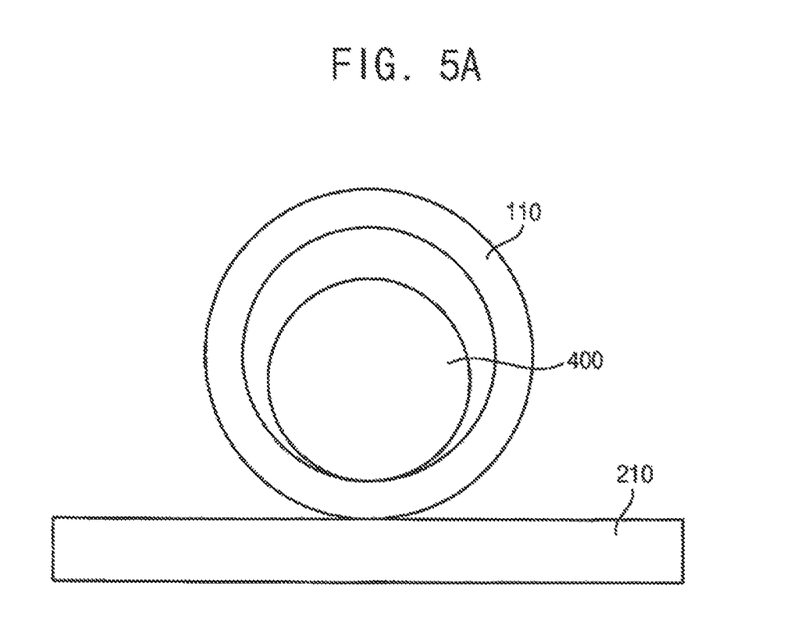
FIGS. 5A and 5B are cross-sectional views illustrating a hardening element (heating device) of the apparatus for liquid transfer imprint lithography in FIG. 1.
Figure 5B:
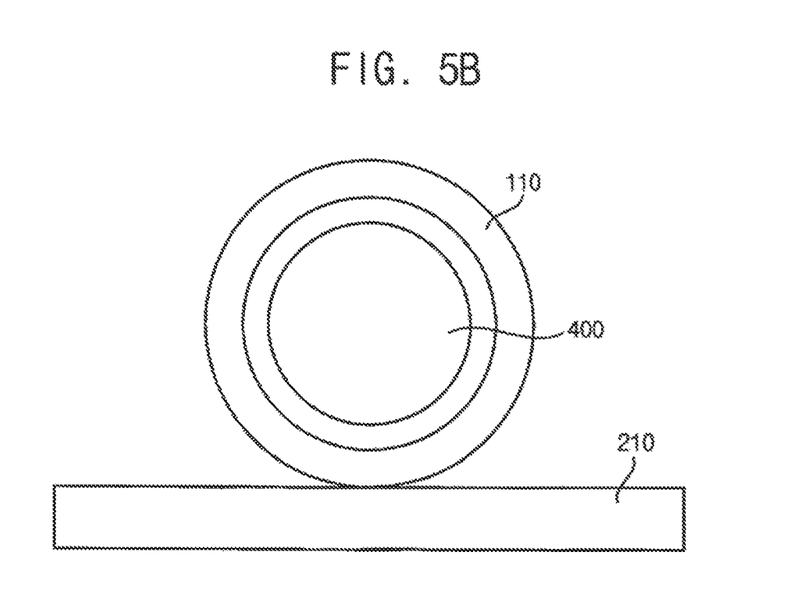
Figure 6:
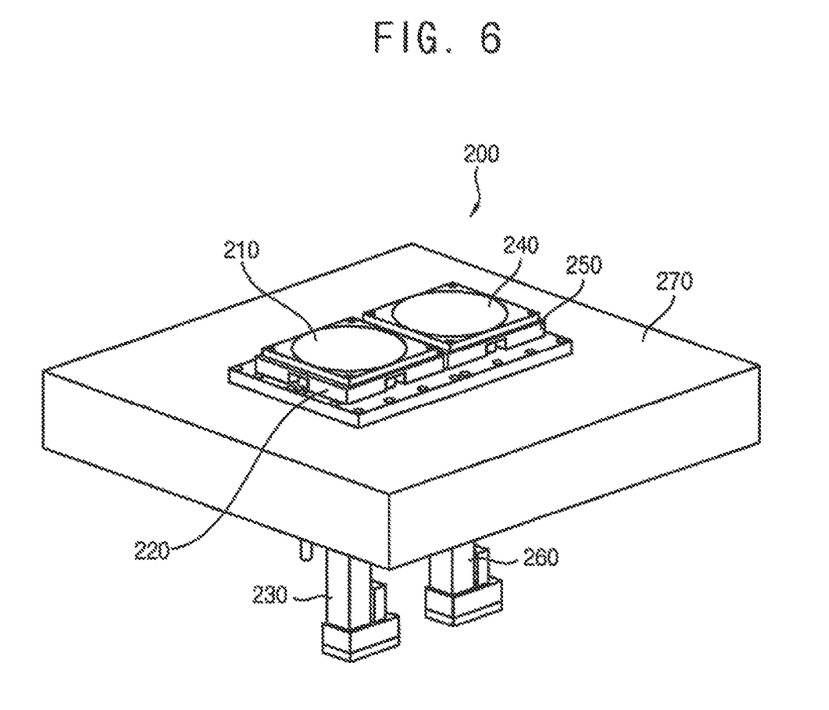
FIG. 6 is a perspective view illustrating a plane unit of the apparatus for liquid transfer imprint lithography in FIG. 1.
Figure 7A:
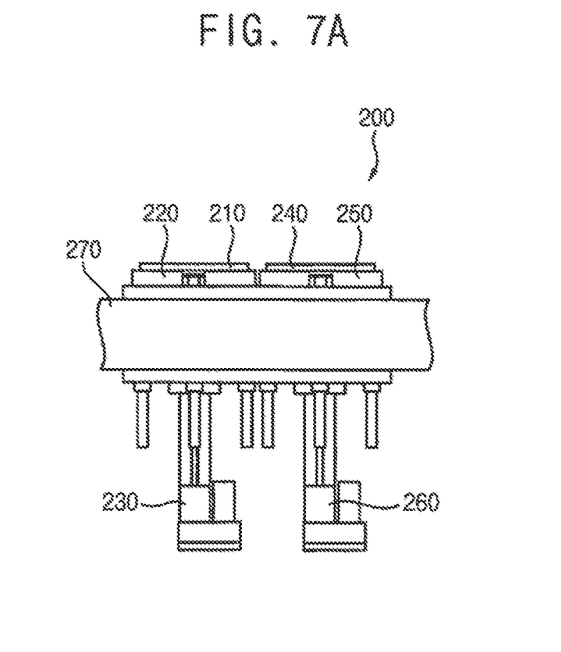
FIGS. 7A, 7B and 7C are front views illustrating operations of the lane unit in FIG. 6.
Figure 7B:
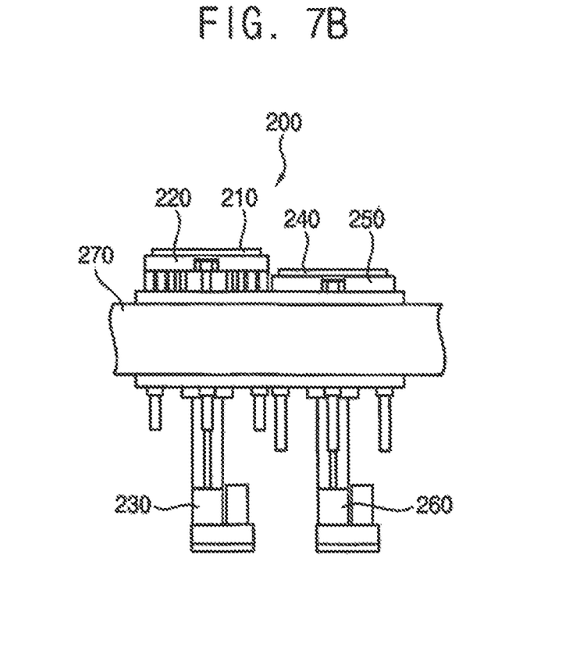
Figure 7C:
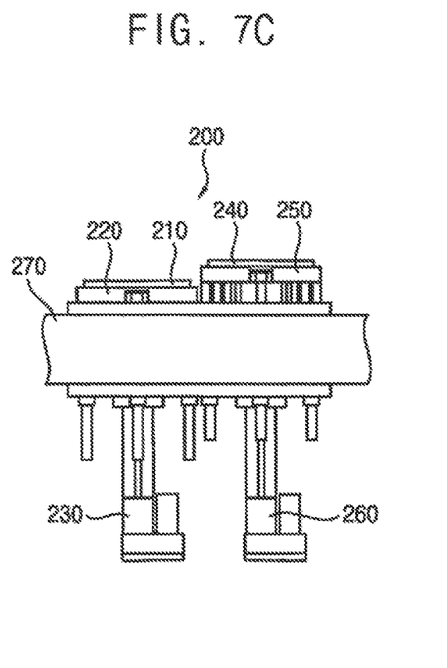

FIG. 1 is a perspective view illustrating an apparatus for liquid transfer imprint lithography according to the present example embodiment of the present invention. FIG. 2 is a perspective view illustrating a roll unit of the apparatus for the liquid transfer imprint lithography in FIG. 1. FIG. 3 is a side view illustrating a roll unit of the apparatus for the liquid transfer imprint lithography in FIG. 1. FIGS. 4A and 4B are process diagrams of adjusting a position when ultraviolet rays are irradiated as a curing element in the apparatus for the liquid transfer imprint lithography in FIG. 1. FIGS. 5A and 5B are cross-sectional views illustrating a hardening element (heating device) of the apparatus for liquid transfer imprint lithography in FIG. 1. FIG. 6 is a perspective view illustrating a plane unit of the apparatus for liquid transfer imprint lithography in FIG. 1. FIGS. 7A, 7B and 7C are front views illustrating operations of the plane unit in FIG. 6.

Referring to FIGS. 1, 2 and 3, the apparatus 1 for liquid transfer imprint lithography according to the present example embodiment includes a roll unit 100, a plane unit 200 and a control unit 300.

The roll unit 100 includes a roll stamp 110, a horizontal moving stage 120, a roll angular compensating stage 130 and a roll rotating part 140.

The roll stamp 110 has a hollow cylindrical shape, and has a hardening or curing element 400 inside of the roll stamp 110. A pattern is formed an outer surface of the roll stamp 110. For example, a film-type stamp having the pattern formed on a surface thereof, may be attached to the outer surface of the roll stamp 110. Alternatively, the pattern may be directly formed on the outer surface of the roll stamp 110.

The horizontal moving stage 120 moves the roll stamp 110 along an X axis. The roll angular compensating stage 130 adjusts an angle of the roll stamp 110. The roll rotating part 140 rotates the roll stamp 110 with a constant velocity.

For example, the roll stamp 110 may be aligned to a position for a pattern transfer by the horizontal moving stage 120 in the patterning process. The roll stamp 110 may be transferred along the horizontal direction and be rotated by the roll rotating part 140, and thus a pattern of the roll stamp 110 may be transferred to an entire surface of a flat substrate.

Here, the roll angular compensating stage 130 rotates the roll stamp 110 along a roll direction, and a center of the rotation is located on the surface of the roll stamp 110. Thus, the roll stamp 110 may be prevented from being slipped along a Y axis when rotating.

In addition, the roll rotating part 140 rotates the roll stamp 110 along a pitch direction, and is driven synchronized with the horizontal moving stage 120. Thus, the roll stamp 110 may be prevented from being slipped along the X axis at the contact area.

The roll rotating part 140 includes a rotating motor, and further includes an angular sensor 150 to control a rotating angle of the roll stamp 110.

The roll stamp 110 includes a timing belt connected between a pulley at a roll and a pulley at a motor. The pulley at the roll is disposed along an outer surface at a side of the roll stamp 110, and the pulley at the motor is connected to the rotating motor. Thus, the roll stamp 110 is rotated by the rotating motor, and the rotating angle of the roll stamp 110 is controlled by the angular sensor 150.

A rotating velocity and a moving velocity of the horizontal roving stage 120 of the roll unit 100 are determined by the following equation.

$$\omega = \frac{180}{\pi(R+t)}v$$

Here, R is a radius of the roll (mm), t is a thickness of a stamp (pattern) attached to a surface of the roll (mm), v is a moving velocity of the horizontal moving stage 120 (mm/s), and w is a rotating velocity of the roll stamp 110 (°/s).

The above equation is in a condition that the roll stamp 110 rolls on the flat substrate and the roll stamp 110 and the substrate make contact with each other without slipping.

The plane unit 200 is disposed under the roll unit 100, and includes a first substrate 210, a first fixing chuck 220, a first substrate driving part 230, a second substrate 240, a second fixing chuck 250 and a second substrate driving part 260.

A resist is coated on the first substrate 210 with a constant thickness, and the first substrate 210 is disposed under the roll stamp 110.

The second substrate 240 is spaced apart from the first substrate 210 along the X direction, and is parallel with the first substrate 210.

Each of the first and second substrates 210 and 240 may be a rectangular shape, a circular shape and so on, and may be a large-sized substrate or a small-sized substrate. Further, the shape and size of the first and second substrates 210 and 240 may be variously changed.

The first and second substrates 210 and 240 are respectively fixed by the first and second fixing chucks 220 and 250 which are disposed on the table 270.

Referring to FIG. 6, the first substrate driving part 230 vertically moves the first fixing chuck 220 along a Z axis, and the second substrate driving part 260 vertically moves the second fixing chuck 250 along the Z axis. Thus, the first and second substrates 210 and 240 make contact with and are pressed with the roll stamp 110 so that the pattern of the roll stamp 110 is transferred, and after transferring, the first and second substrates 210 and 240 are detached from the roll stamp 110.

For example, the first and second substrate driving parts 230 and 260 are independently driven, and thus the driving process of the first and second substrate driving parts 230 and 260 may be properly changed to various processes.

In addition, in the present example embodiment, each of the first and second substrates 210 and 240 moves along the Z axis due to the independent driving process of the first and second substrate driving parts 230 and 260, and thus the pattern of the roll stamp 110 may be continuously transferred due to the independent rotation and horizontal movement of the roll stamp 110.

The control unit 300 controls an operation of roll unit 100 and the plane unit 200. Thus, the resist attached to the roll stamp 110 by making the roll stamp 110 and the first substrate 210 contact with each other and pressing the roll stamp 110 and the first substrate 210 with each other is transferred to the second substrate 240 again.

Here, the control unit 300 turns off the hardening or curing element 400 when the roll stamp 110 and the first substrate 210 make contact with each other, and turns on the hardening or curing element 400 when the roll stamp 110 and the second substrate 240 make contact with each other.

Accordingly, in the apparatus for liquid transfer imprint lithography according to the present example embodiment, the resist coated on the first substrate 210 is partially transferred on the surface of the roll stamp 110 on which the pattern is formed. When the rotation and the horizontal movement are finished, the roll stamp 110 makes contact with the second substrate 240 with a predetermined pressure and thus the resist transferred on the surface of the roll stamp 110 is transferred on the second substrate 240 again and is hardened or cured. Thus, the resist is formed on the second substrate 240.

The control unit 300 controls an operation of the apparatus 1, and may include CPU, DSP (digital signal processor), a micro processor or etc.

As illustrated in FIGS. 4A and 4B, the hardening or curing element 400 may be an ultraviolet irradiating device 400 irradiating ultraviolet rays to a surface on which the roll stamp 110 and the plane unit 200 make a line contact with each other along a lower direction.

The ultraviolet irradiating device 400 irradiates the ultraviolet rays along the lower direction, and irradiates the ultraviolet rays with a linear shape to the area in which the roll stamp 110 and the first substrate 210 or the second substrate 240 make contact with each other.

Thus, the ultraviolet irradiating device 400 is properly positioned in assembling inside of the roll stamp 110 and is precisely and accurately positioned based on the performance of the ultraviolet irradiating device 400.

For example, as illustrated in FIGS. 4A and 4B, first and second adjusting stages are respectively connected to both end portions of the ultraviolet irradiating device 400, and thus the position of the ultraviolet irradiating device 400 may be adjusted along the rotating direction and the horizontal direction.

Here, a central line BB' in the area to which the ultraviolet rays are irradiated from the ultraviolet irradiating device 400 is aligned to a central line AA' of the surface on which the roll stamp 110 and the first substrate 210 or the second substrate 240 make contact with each other.

Accordingly, in the apparatus 1 for liquid transfer imprint lithography according to the present example embodiment, the ultraviolet rays may be accurately irradiated to the contact line at which the roll stamp 110 and the plane unit 200 make contact with each other.

Alternatively, as illustrated in FIGS. 5A and 5B, the hardening or curing element 400 may be a heating device 400. As the heating device 400, an electric method such as a coil type induced heating device or a cartridge heater, or a circulating method in which a high temperature heat exchanger is circulated in a predetermined space may be applied.

A position of the heating device 400 is unnecessary to be adjusted. As illustrated in FIG. 5A, the heating device 400 is disposed inside of the roll stamp 110 and is equipped to make contact with a lower surface of an inner surface of the roll stamp 110. Alternatively, as illustrated in FIG. 5b, the heating device is disposed inside of the roll stamp 110 and is equipped to be spaced apart from the inner surface of the roll stamp 110.

Thus, the heating device 400 and the roll stamp 110 may be prevented from being damaged when the heating device 400 is heated and expanded.

For example, the roll stamp 110 may include a glass or quartz, to have a coefficient of thermal expansion lower than a metal based heating device, and thus the roll stamp 110 is formed lager than the heating device 400 to prevent from being damaged due to the expansion of the heating device 400.

As the hardening or curing element 400, the heating device 400 may be used when the resist coated on the first substrate 210 is a they thermosetting resist, and the ultraviolet irradiating device 400 may be used when the resist coated on the first substrate 210 is a UV curing resist.

Accordingly, in the apparatus 1 for liquid transfer imprint lithography according to the present example embodiment, the resist coated on the first substrate 210 is transferred to the roll stamp 110, and the surface pattern of the roll stamp 110 is formed on the resist when the resist on the roll stamp 110 is retransferred to the second substrate 240. Thus, the nano imprinting process is stably performed in the liquid transfer imprint lithography on the large-sized substrate or the flexible substrate.

In addition, in the present example embodiment, the hardening or curing element 400 is equipped inside of the roll stamp 110, and thus the apparatus may be more easily equipped and the hardening or curing element 400 may be more easily and accurately aligned in the area in which the roll stamp 110 and the substrate make contact with each other.

FIGS. 8A to 8G are front views illustrating a method for liquid transfer imprint lithography according to the present example embodiment of the present invention.

In the present example embodiment, the method for liquid transfer imprint lithography using the apparatus 1 for liquid transfer imprint lithography as explained to referring to FIGS. 1 to 7C is explained as follows.

The method according to the present example embodiment includes an aligning step S100, a first substrate moving step S200, a first transferring step S300, a second substrate moving step S400 and a second transferring step S500.

Figure 8A:
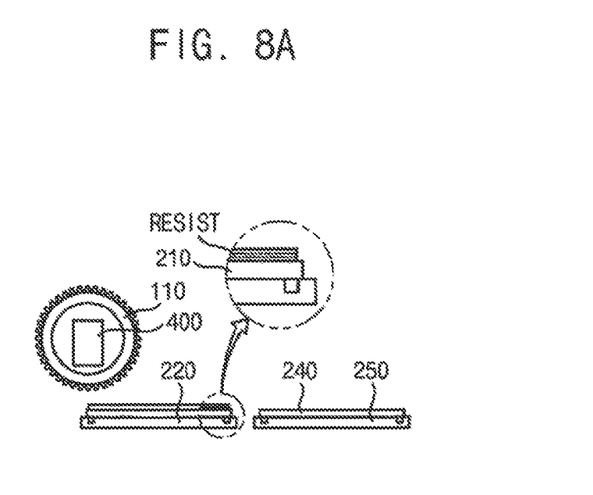
FIGS. 8A to 8G are front views illustrating a method for liquid transfer imprint lithography according to the present example embodiment of the present invention.
Figure 8B:
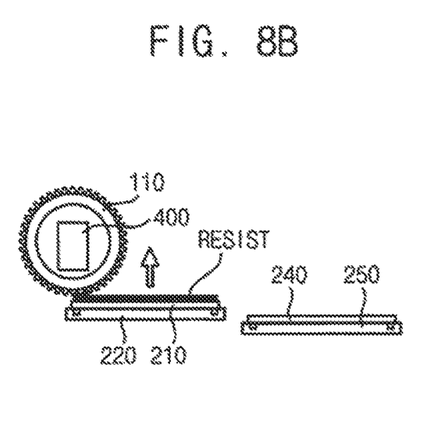
Figure 8C:
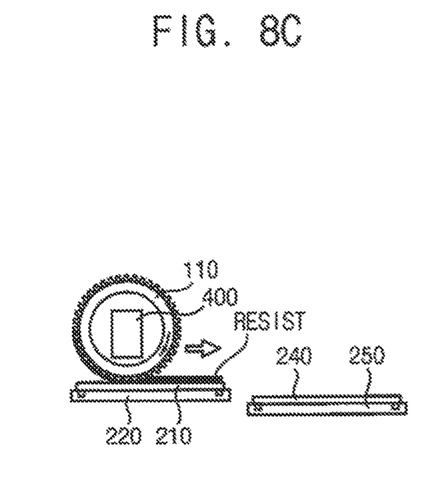
Figure 8D:
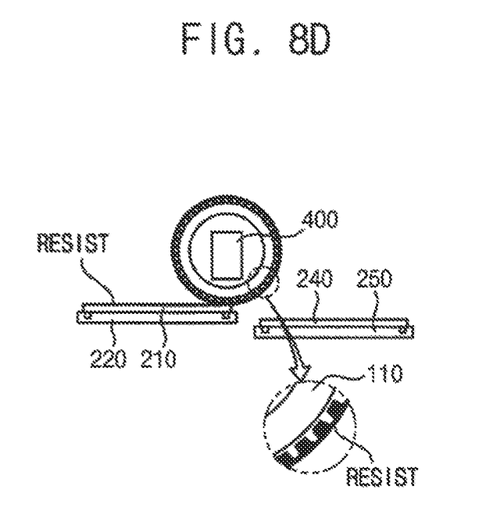

In the aligning step S100, as illustrated in FIG. 8A, the roll unit 100 and the plane unit 200 are aligned to make contact with each other at a predetermined position. A position along the X axis is aligned by the horizontal moving stage 120. An angle is adjusted by the roll angular compensating stage 130, such that the first substrate 210 and the roll stamp 110 make the line contact with each other and a constant pressure is applied in the line contact area.

In the first substrate moving step S200, as illustrated in FIG. 5B, an end portion of the first substrate 210 on which the resist is coated with a constant thickness, makes a line contact with the roll stamp 110, and then the first substrate 210 moves upwardly by the first substrate driving part 230. Thus, the roll stamp 110 and the first substrate 210 are pressed with each other.

In the first transferring step S300, as illustrated in FIGS. 5C and 5D, the roll stamp 110 rotates on the first substrate 210 with a predetermined pressure and with a constant velocity due to the roll rotating part 140, and the roll stamp 110 moves from a first side to a second side opposite the first side of the first substrate 210 due to the horizontal moving stage 120.

Thus, the resist coated on the first substrate 210 is partially transferred on the surface of the roll stamp 110 on which the pattern is formed.

Here, the control unit 300 controls the hardening or curing element 400 not to be operated.

Figure 8E:
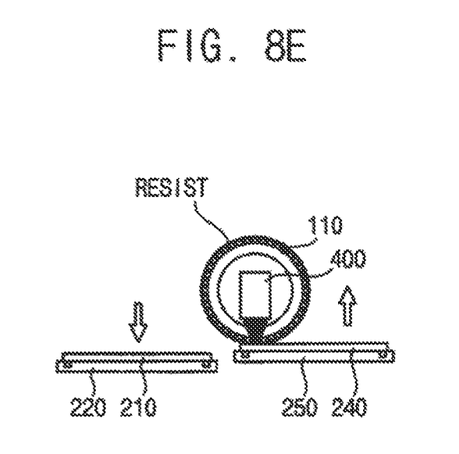

In the second substrate moving step S400, as illustrated in FIG. 8E, when the roll stamp 110 stops rotating and moving with making contact the first substrate 210, the first substrate 210 moves downwardly due to the first substrate driving part 230.

Then, the roll stamp 110 moves to be positioned at an end portion of the second substrate 240, and the second substrate 210 move upwardly due to the second substrate driving part to make contact with the roll stamp 110 with a predetermined pressure.

Figure 8F:
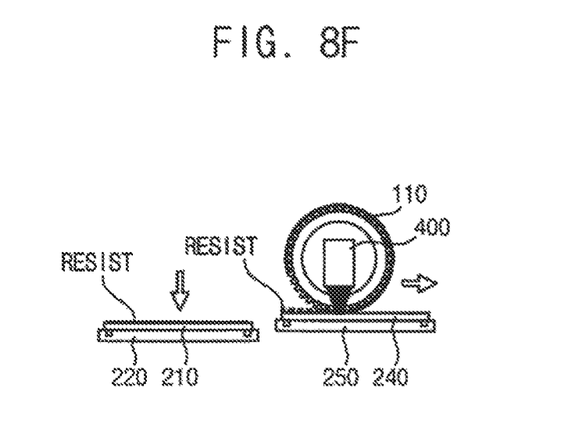

In a second transferring step S500, as illustrated in FIG. 8F, the roll stamp 110 and the second substrate 240 make contact with each other and are pressed with each other, and the roll stamp 110 moves from a first side to a second side opposite to the first side of the second substrate 210. Thus, the resist attached to the surface of the roll stamp 110 is transferred to the second substrate 240, and at the same time, the pattern on the surface of the roll stamp 110 is also transferred to the second substrate 240.

Here, the control unit 300 operates the hardening or curing element 400, and thus the resist in the line contact area between the roll stamp 110 and the second substrate 240 is hardened or cured.

As explained above, the hardening or curing element 400 may be the heating device 400 or the ultraviolet irradiating device 400 based on the kinds of the resist coated on the first substrate 210.

Figure 8G:
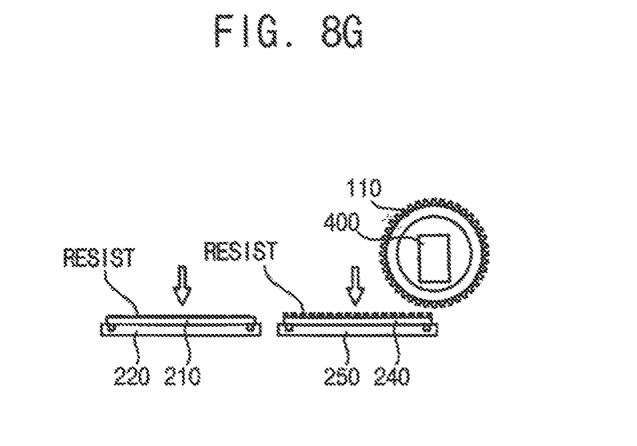

Finally, as illustrated in FIG. 8G, the second substrate 240 moves downwardly due to the second substrate driving part 260, and the roll stamp 110 is detached from the second substrate 240.

Accordingly, in the present example embodiment, the roll stamp 110 and the flat substrate may continuously make contact with each other, and thus the patterning process in which the resist is hardened or cured in the line contact area may be variously changed.

According to the present invention, the surface pattern of the roll stamp is transferred to the resist when the resist is re-transferred to the second substrate after the resist coated on the first substrate is transferred to the roll stamp, so that nano imprint process may be more stably performed to the large-sized or flexible substrate using the liquid transfer imprinting method.

More specifically, the apparatus according to the present example embodiment includes the roll stamp having a hardening or curing element and the roll unit adjusting a position and a rotation of the roll stamp, and thus the roll stamp may make a line contact with the first and second substrates and the curing or the hardening may be performed in the line contact area at the same time.

Further, the hardening or curing element is equipped inside of the roll stamp, and thus the equipment may be set up more easily, and the hardening or curing element may be more accurately aligned in the line contact area. Thus, the nano imprinting process may be performed more precisely and more accurately.

In addition, the first and second substrates may be independently adjusted to move along a Z direction, and thus the pattern may be continuously transferred due to the rotation and the horizontal movement of the roll stamp.

Accordingly, the roll stamp and the plane substrate make a continuous line contact with each other, and thus the apparatus according to the present example embodiments be variously used in the patterning methods including hardening or curing the line contact area.

The foregoing is illustrative of the present teachings and is not to be construed as limiting thereof. Although a few exemplary embodiments have been described, those skilled in the art will readily appreciate from the foregoing that many modifications are possible in the exemplary embodiments without materially departing from the novel teachings and advantages of the present disclosure of invention. Accordingly, all such modifications are intended to be included within the scope of the present teachings. In the claim, means-plus-function clauses are intended to cover the structures described herein as performing the recited function and not only structural equivalents but also functionally equivalent structures.

What is claimed is:

1. An apparatus for liquid transfer imprint lithography using a roll stamp, the apparatus comprising:
   a roll unit comprising a roll stamp, a horizontal moving stage, a roll angular compensating stage and a roll rotating part, the roll stamp having a hollow cylindrical shape, having a hardening or curing element and having a pattern formed on an outer surface of the roll stamp, the horizontal moving stage moving the roll stamp along an X axis, the roll angular compensating stage adjusting an angle of the roll stamp, the roll rotating part rotating the roll stamp with a constant velocity;
   a plane unit disposed under the roll unit and comprising a first substrate, a first fixing chuck, a first substrate driving part, a second substrate, a second fixing chuck and a second substrate driving part, a flat resist being coated on the first substrate, the first fixing chuck being disposed over a table and the first substrate being fixed at the first fixing chuck, the first substrate driving part vertically moving the first fixing chuck along a Z axis, the second substrate being spaced apart from the first substrate and being arranged with the first substrate in parallel, the second fixing chuck being disposed over the table and the second substrate being fixed to the second fixing chuck, the second substrate driving part vertically moving the second fixing chuck along the Z axis; and
   a control unit controlling an operation of the roll unit and the plane unit, the roll stamp and the first substrate making contact with each other and being pressed with each other so that the resist attached to the surface of the roll stamp being re-transferred to the second substrate.

2. The apparatus of claim 1, wherein the roll unit further comprises an angular sensor measuring a rotating angle of the roll stamp rotated with the constant velocity by the roll rotating part.

3. The apparatus of claim 1, wherein the hardening or curing element comprises an ultraviolet irradiating device irradiating ultraviolet rays along a lower direction to a surface on which the roll stamp and the plane unit make the line contact with each other,
   wherein first and second adjusting stages are connected to both sides of the hardening or curing element such that a position along a yaw direction and the X axis is adjusted.

4. The apparatus of claim 1, wherein the hardening or curing element comprises a heating device heating a surface on which the roll stamp and the plane unit make the line contact with each other.

5. The apparatus of claim 1, wherein the control unit turns off the hardening or curing element when the roll stamp and the first substrate make contact with each other, and
   the control unit turns on the hardening or curing element when the roll stamp and the second substrate make contact with each other.

6. A method for liquid transfer imprint lithography using the apparatus of claim 1, the method comprising:
   aligning the roll stamp at a position using the horizontal moving stage and the roll angular compensating stage;
   moving the first substrate to an upper portion using the first substrate driving part so that a side end portion of the first substrate on which the flat resist is coated and the roll stamp make the line contact with each other and are pressed with each other with a predetermined pressure;
   first transferring in which the roll rotating part rotates the roll stamp with the constant velocity and the horizontal moving stage moves the roll stamp from a first side of the first substrate to a second side of the first substrate opposite to the first side, and thus the resist of the first substrate are partially attached to the surface of the roll stamp;
   moving the second substrate to the upper portion using the second substrate driving part so that the roll stamp is positioned at a side end portion of the second substrate after moving the first substrate to a lower direction; and
   second transferring in which the roll stamp makes contact and are pressed with the second substrate and moves from a first side of the second substrate to a second side of the second substrate opposite to the first side so that the resist attached to the surface of the roll stamp is transferred to the second substrate and the resist is hardened or cured by turning on the hardening or curing element in the area in which the roll stamp and the second substrate make contact with each other.

* * * * *